United States Patent [19]

Tanaka et al.

[11] Patent Number: 5,675,465
[45] Date of Patent: Oct. 7, 1997

[54] FIELD GROUND FAULT DETECTOR AND FIELD GROUND FAULT RELAY FOR DETECTING GROUND FAULT CORRESPONDING TO DC COMPONENT EXTRACTED FROM GROUND FAULT CURRENT

[75] Inventors: Toshio Tanaka; Yoshinori Takei; Tetsuo Ugawa, all of Tokyo, Japan

[73] Assignee: Kabushiki Kaisha Toshiba, Kanagawa-ken, Japan

[21] Appl. No.: 394,323

[22] Filed: Feb. 23, 1995

[30] Foreign Application Priority Data

Feb. 25, 1994 [JP] Japan ................... 6-028580

[51] Int. Cl.$^6$ ............................................ H02H 3/00
[52] U.S. Cl. .......................... 361/42; 361/20; 361/23
[58] Field of Search ........................... 361/42, 31, 23, 361/20, 47, 49; 324/509, 510

[56] References Cited

U.S. PATENT DOCUMENTS

| 4,187,525 | 2/1980 | Nagura .......................... 361/42 |
| 4,410,925 | 10/1983 | Tucker et al. ................. 361/42 |
| 4,679,111 | 7/1987 | Koch et al. .................... 361/42 |
| 4,864,242 | 9/1989 | Hurley ........................... 324/510 |

FOREIGN PATENT DOCUMENTS

| 0 412 024 A1 | 2/1991 | European Pat. Off. ........ G01R 19/02 |
| 2 194 863 | 3/1988 | United Kingdom ............. H02H 3/17 |

OTHER PUBLICATIONS

Patent Abstracts of Japan, vol. 8, No. 229 (E-273), Oct. 20, 1984, JP59110395.

Patent Abstracts of Japan, vol. 5, No. 42 (P-053), Mar. 20, 1981, JP55164378.

Patent Abstracts of Japan, vol. 15, No. 486 (E-1143), Dec. 10, 1991, JP03212117.

Elektrotechnik, "Erkennt Effektivwerte, Leistungsschalter Mit RMS-Messystem," vol. 71, No. 4, Jun. 1989, p. 40.

*Primary Examiner*—Jeffrey A. Gaffin
*Assistant Examiner*—S. Jackson
*Attorney, Agent, or Firm*—Finnegan, Henderson, Farabow, Garrett & Dunner, L.L.P.

[57] ABSTRACT

According to a field ground fault detector, a predetermined resistor is connected in series to a predetermined DC voltage. A DC voltage is applied between an N electrode side field circuit of a generator and a ground through the resistor. A voltage applied between terminals of the resistor is input to a low-pass filter. A voltage applied between the N electrode side field circuit and the ground is input to another low-pass filter. Output voltages of the low-pass filters are input to a level ratio determining circuit. The level ratio determining circuit outputs the determined result of the ground fault to the outside of the field ground fault detector corresponding to these voltages. Thus, even if the DC voltage varies or a higher harmonic voltage takes place in a generator of a thyristor exciting type, it does not affect the detecting sensitivity of the ground fault.

12 Claims, 14 Drawing Sheets

FIG. 20A
*PRIOR ART*
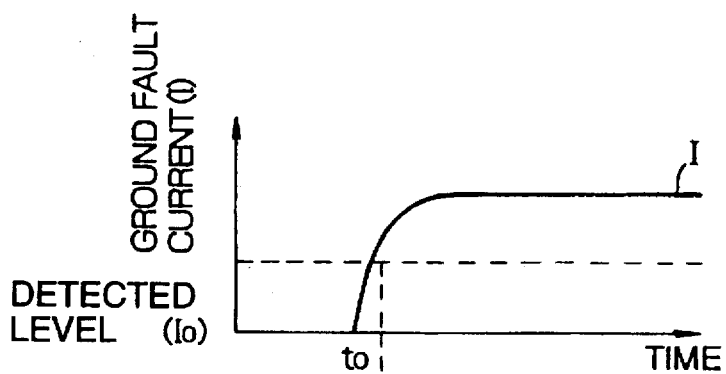
FIG. 20B
*PRIOR ART*
FIG. 20C
*PRIOR ART*
FIG. 21A
*PRIOR ART*
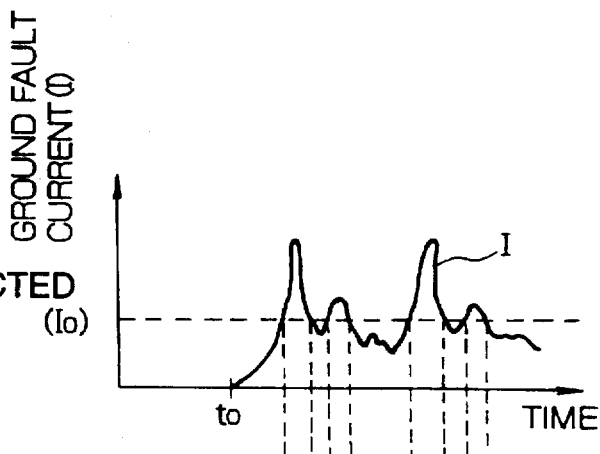
FIG. 21B
*PRIOR ART*
FIG. 21C
*PRIOR ART*

FIELD GROUND FAULT DETECTOR AND FIELD GROUND FAULT RELAY FOR DETECTING GROUND FAULT CORRESPONDING TO DC COMPONENT EXTRACTED FROM GROUND FAULT CURRENT

BACKGROUND OF THE INVENTION

1. Field of the Invention

The present invention relates to a field ground fault detector and field ground fault relay for detecting a ground fault of a field circuit of a generator (including a generating motor), in particular, to a field ground fault detector for supplying a predetermined DC current so as t detect a ground fault.

2. Description of the Related Art

In a conventional field ground fault detector, a predetermined DC voltage is applied between an N side and a ground side of a field circuit of a generator through a resistor. By detecting the amount of the current that flows at output terminals, a ground fault is detected.

Next, with reference to FIG. 19, constructions of a conventional field ground fault detector and a relay thereof will be described.

In FIG. 19, a field coil B generates a magnetic flux that magnetizes a generator A. A positive electrode P and a negative electrode N are disposed at an upper position and a lower position of the field coil B, respectively.

The field ground fault relay 10 (having a detector function) is directly connected between the field circuit (that includes a field coil B and a field breaker F) and the ground so as to determine whether or not a ground fault takes place in the field circuit.

In addition, the field ground fault relay 10 has an internal power supply so as to detect a ground fault in such a condition that the generator A stops or the field breaker F is open (namely, even if a voltage source that causes a ground fault current I to flow in the field circuit is not provided).

The internal power supply is a DC power supply 1 so as to detect an insulation resistance (namely, a DC resistance) of the field circuit without an influence of a stray capacity formed between the field circuit and the ground.

When a ground fault takes place in the condition that the insulation resistance of the field circuit is satisfactorily high, a ground fault current I that flows from the DC power supply 1 in the field ground fault relay to the ground fault relay is very weak. However, when the insulation resistance of the field circuit decreases or a ground fault takes place, the ground fault current I that flows from the field ground fault relay 10 depends on the voltage of the DC power supply 1, an internal resistor 2 of the relay, and a ground fault resistor 12. In comparison with the condition that the insulation resistance is satisfactorily high, the ground fault current I is remarkably high.

The conventional field ground fault relay 10 is constructed due to the fact that the insulation resistance remarkably varies depending on whether or not a ground fault of the field circuit takes place and thereby the ground fault current I that flows from the field ground fault relay correspondingly varies.

In other words, as described above, the conventional field ground fault relay 10 has the internal DC power supply 1, which causes the ground fault current I to flow, so as to prevent the relay 10 from being affected by the field voltage. The resistor 2, a rectifier 13, and a level detecting circuit 14 are connected in series between the field circuit and the DC power supply 1.

The resistor 2 limits a ground fault current when a ground fault takes place between the field circuit and the ground. In addition, the resistor 2 controls a current that flows in the field ground fault relay 10 when an invert voltage of the inner power supply of the relay is applied from the outside of the relay.

The rectifier 13 limits the flowing direction of the current. In addition, the rectifier 13 protects the inner circuit of the field ground fault relay 10 against the inverse voltage applied from the field circuit to the field ground fault relay.

The field ground fault relay 10 detects the amount of the ground fault current that flows to a ground fault point of the field circuit from the field ground fault relay 10 corresponding to an output of a level detecting circuit 14 and determines whether or not a ground fault takes place. In addition, to prevent the relay from supplying the current in the condition that the insulation of the field circuit continues for a short time, the field ground fault relay 10 provides an operation time delay circuit 15 as a timer for detecting the continuance of the ground fault state. Thus, when the field ground fault relay 10 is connected to the field circuit, the operation time delay circuit 15 prevents the field ground fault relay from unnecessarily operating against a transient current that flows in a ground capacitor 11 formed between the field circuit and the ground (namely a stray capacitor).

An auxiliary relay 16 outputs a contact output to an external sequence corresponding to the operation state of the relay.

Next, a ground fault current that flows upon occurrence of a ground fault in the field circuit will be described.

When a ground fault takes place in the field circuit of the negative electrode N of the field coil B through the ground fault resistor 12, the insulation resistance between the field circuit and the ground decreases. In addition, a closed circuit of the DC power supply 1 of the field ground fault relay 10, the resistor 2, the rectifier 13, the field circuit of the negative electrode N of the field circuit, the ground fault resistor 12, the ground, the level detecting circuit 14, and the DC power supply 1 is formed. Thus, the ground fault current I, which depends on the voltage of the DC power supply 1 of the field ground fault relay 10, the resistor 2, and the ground fault resistor 12, flows. The level detecting circuit 14, which detects the level of the absolute value of the ground fault current I, determines whether or not a ground fault takes place. Only when the operation of the level detecting circuit 14 continues for a time period designated by the operation time delay circuit 15, the output of the field ground fault relay 10 is supplied to the outside thereof and the field breaker F is shut off so as to stop the generator A.

FIGS. 20A–21C and 21A–21C show the ground fault current I and an operational time chart of the conventional ground fault relay 10. With reference these charts, a time response of the field ground fault relay 10 will be described.

The timing charts of FIGS. 20A–20C show a response of the field ground fault relay in the case that the field breaker F is open. When the field breaker F is open, only a DC power supply 1 of the field ground fault relay 10 causes the ground fault current I to flow to the ground fault resistor 12. Thus, the ground fault current I that flows in the ground fault resistor has a DC current waveform that does not have a ripple component. This current is referred to as a flat current.

Thus, the level detecting circuit 14 outputs an output signal 14A of the level detecting circuit 14 when the amount of the ground fault current I that flows in the ground fault resistor 12 of the field circuit exceeds a predetermined detecting level $I_0$ that has been designated an occurrence of a ground fault.

The level detecting signal 14A is output to the operation time delay circuit 15 as a delay signal 15A in which the output signal is delayed for a predetermined time period. In addition, the level detecting circuit 14 outputs a signal 16A that causes an auxiliary relay 16 to operate so as to shut off the field breaker F.

FIGS. 21A–21C are timing charts showing a response of the field ground fault relay 10 in the case that the field breaker F is closed and an exciting current is applied to a field coil A.

When the field breaker F is closed, the power supply that causes the ground fault current I to flow to the ground fault resistor 12 is a composite voltage of the DC power supply 1 of the field ground fault relay 10 and an induced voltage of a three-phase AC power supply that is obtained by varying the conduction angle of a thyristor. Thus, the ground fault current I that flows in the ground fault resistor has a current waveform containing a ripple component as shown in FIG. 21A.

Thus, the level detecting circuit 14 outputs an output signal 14A when the amount of the ground fault current I exceeds the predetermined detecting level $I_0$. However, the output signal 14A has an intermittent waveform.

Since the level detecting signal 14A is input to the operation time delay circuit 15 and output as the delay signal 15A in which the output signal is delayed for the predetermined time period, the output signal 15A of the operation time delay circuit 15 is zero (namely, an output that causes the auxiliary relay 16 to operate is not generated). Thus, the field ground fault relay 10 and the field breaker F do not operate.

As a result, even if a ground fault takes place, the field ground fault relay does not operate.

Thus, according to the above-described related art reference, since the occurrence of the ground fault is determined corresponding to only the amount of the current that flows at the output terminals, when the predetermined DC voltage varies, the detecting sensitivity of the ground fault varies.

In addition, when the amount of the current is determined by detecting the peak value thereof, in a generator field circuit of a thyristor exciting type, as shown in FIG. 21A, a higher harmonic voltage takes place other than the DC voltage. Thus, the higher harmonic voltage is induced to the output terminals of the field ground fault detector due to the stray capacitor. Consequently, the current that flows at the output terminals becomes an intermittent current, thereby intermittently detecting a ground fault.

Thus, even if a ground fault takes place, it cannot be properly detected. To solve this problem, a restoration delay circuit using a timer may be disposed downstream of the operation time delay circuit 15. However, in this case, the current that flows in the stray capacitor causes a ground fault to be incorrectly detected.

SUMMARY OF THE INVENTION

The present invention is made so as to solve the above-described problems. A first object of the present invention is to provide a field ground fault detector for detecting a ground fault with a sensitivity that is not effected by an variation of a predetermined DC voltage.

A second object of the present invention is to provide a field ground fault detector applied for a field circuit of a generator of a thyristor exciting type with a high performance that is free from an incorrect detection and a non-detection of a ground fault.

A third object of the present invention is to provide a field ground fault detector that can determine the position at which a ground fault takes place.

A fourth object of the present invention is to provide a field ground fault detector that can measure the resistance of a ground field resistor.

To solve such problems, a first aspect of the present invention is a field ground fault detector for detecting a ground fault of a field circuit connecting a field winding of a generator and an exciting circuit, comprising a DC voltage source connected between a negative electrode of the field circuit and a ground through a predetermined resistor, a means for extracting a DC component corresponding to a current amount or a voltage amount supplied from a circuit constructed of the resistor and the DC voltage source, and a means for detecting a ground fault corresponding to the DC component.

A second aspect of the present invention is a field ground fault detector for detecting a ground fault of a field circuit connecting a field winding of a generator and an exciting circuit, comprising a DC voltage source connected between a negative electrode of the field circuit and a ground through a predetermined resistor, a first filter circuit for extracting a DC voltage from a voltage applied between both terminals of the resistor, a second filter circuit for extracting a DC voltage from a voltage applied between a negative electrode side of the field circuit and the ground, and a determining circuit for determining whether or not a ground fault takes place corresponding to the ratio of an output voltage of the first filter circuit and an output voltage of the second filter circuit.

A third aspect of the present invention is a field ground fault relay for determining a ground fault of a field circuit connecting a field winding of a generator and an exciting circuit, comprising a DC power supply circuit connected between a negative electrode side of the field circuit and a ground through a predetermined resistor, a calculating circuit for calculating an average value or an effective value of a current that flows in the DC power supply circuit and outputting the average value or the effective value, a level detecting circuit for generating an output when an output of the calculating circuit exceeds a predetermined ground fault current detecting level, an operation delay circuit for generating an output when an output of the level detecting circuit continues for a predetermined time period, and an output circuit for inputting an output of the operation delay circuit and outputting a shut-off command or an alarm command.

According to the present invention, since a DC component is extracted from a ground fault current that flows in the DC voltage source and a ground fault is determined corresponding to the extracted DC component, even if the DC voltage varies due to the exciting circuit, it does not affect the detecting sensitivity of the ground fault without problems of incorrect detection and non-detection of the ground fault.

These and other objects, features and advantages of the present invention will become more apparent in light of the following detailed description of a best mode embodiment thereof, as illustrated in the accompanying drawings.

BRIEF DESCRIPTION OF THE DRAWINGS

FIGS. 20A–20C are signal timing charts for the conventional field ground relay; and FIGS. 21A–21C are signal timing charts for the conventional field ground relay.

DESCRIPTION OF THE PREFERRED EMBODIMENTS

First, with reference to FIG. 1, a field ground fault detector according to an embodiment of the present invention will be described.

Figure 1:
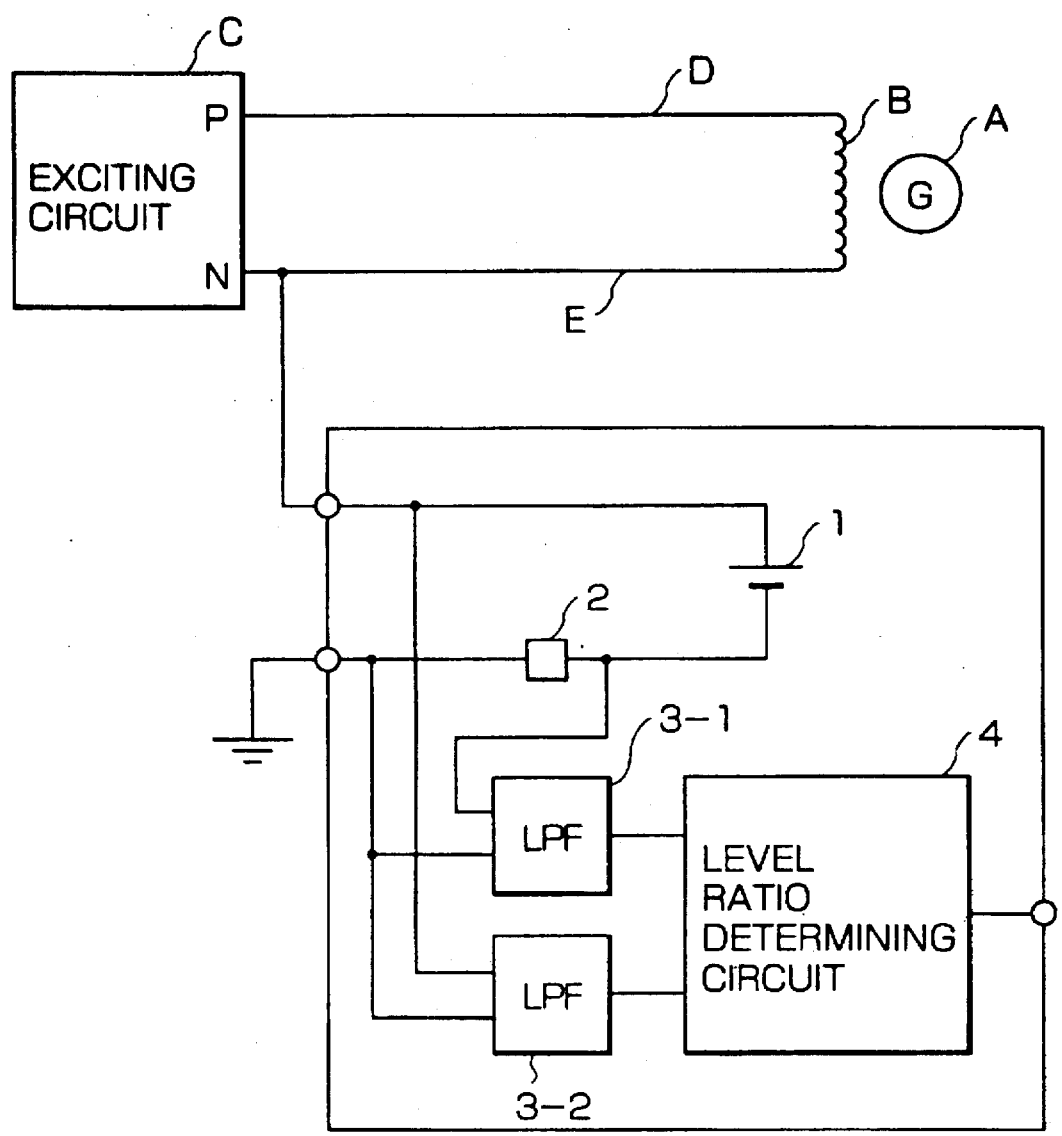
FIG. 1 is a schematic diagram showing a construction of a field ground fault detector according to the present invention.

As shown in FIG. 1, the field ground fault detector detects a ground fault of a field circuit of a generator. The field circuit is composed of a field winding B of a generator A, an exciting circuit C, a P (positive electrode) side field circuit D, and an N (negative electrode) side field circuit E (these circuits connect the exciting circuit C and the field winding B of the generator).

In the field ground fault detector, a resistor 2 is connected in series to a predetermined DC voltage source 1. The DC voltage source 1 supplies a DC voltage between the N side field circuit E and the ground through the resistor 2. The voltage applied between both terminals of the resistor 2 is supplied to a low-pass filter 3-1. The voltage applied between the N side field circuit E and the ground is supplied to a low-pass filter 3-2. The output voltages of the low-pass filters 3-1 and 3-2 are supplied to a level ratio determining circuit 4. The level ratio determining circuit 4 output a determined result of a ground fault to the outside of the field ground fault detector corresponding to these voltages.

When a ground fault takes place in the N side field circuit E, a current of which the DC voltage of the DC voltage source 1 is divided by the sum of the resistance of the resistor 2 and the resistance of a ground fault resistor flows. The voltage applied between the N side field circuit E and the ground is the product of the current and the resistance of the ground fault resistor. The voltage applied to both terminals of the resistor 2 is the product of the current and the resistance of the resistor 2. In other words, the voltage applied to both the terminals of the resistor 2 is proportional to the resistance of the resistor 2. The voltage applied between the N side field circuit E and the ground is proportional to the resistance of the ground fault resistor.

The voltage applied to both the terminals of the resistor 2 is a DC voltage due to the presence of the low-pass filter 3-1. The voltage applied between the N side field circuit E and the ground is a DC voltage due to the presence of the low-pass filter 3-2. The levels of the DC voltages are compared by the level ratio determining circuit 4. Since the level ratio is the ratio of a voltage proportional to the known resistance of the resistor 2 and a voltage proportional to the resistance of the ground fault resistor, the level ratio is proportional to the resistance of the ground fault resistor.

As a criterion of the determination of the level ratio, the resistance of the resistor 2 is known. Thus, when the resistance of the ground fault resistor to be detected is n times as low as or lower than the resistance of the resistor 2, it is determined that a ground fault takes place. In other words, when the DC voltage applied between the N side field circuit E and the ground through the low-pass filter 3-2 is n times as low as or lower than the DC voltage applied to both the terminals of the resistor 2 through the low-pass filter 3-1, it is determined that a ground fault takes place and the detected result is output to the outside.

Basically, DC voltages are applied between both the terminals of the resistor 2 and between the N side field circuit E and the ground. When the exciting circuit C is of a thyristor exciting type, a higher harmonic voltage is generated along with the DC voltages. An AC voltage is inducted by a stray capacitor formed between the N side field circuit E and the ground. Due to the induced AC voltage, AC currents flow in the resistor 2 and the ground fault resistor along with the DC current. Thus, the voltages applied between both the terminals of the resistor 2 and the voltage applied between the N side field circuit E and the ground are not perfect DC voltages. To determine the level ratio of these voltages, the low-pass filters 3-1 and 3-2 are used.

When a ground fault takes place in the P side field circuit D and the field winding B of the generator, the current of which the sum of the excited voltage at the ground fault point and the DC voltage of the DC voltage source 1 is divided by the sum of the resistance of the resistor 2 and the resistance of the ground fault resistor. The voltage applied between both the terminals of the resistor 2 is the product of the current and the resistance of the resistor 2. The voltage applied between the N side field circuit E and the ground is obtained by subtracting the excited voltage at the ground fault point from the product of the current and the resistance of the ground fault resistor. In other words, the ratio of the voltage applied between both the terminals of the resistor 2 and the voltage applied between the N side field circuit E and the ground is not equal to the ratio between the resistance of the resistor 2 and the resistance of the ground fault resistor. The voltage applied between the field circuit E and the ground decreases by the excited voltage at the ground fault point. Thus, the ground fault that takes place at the P side field circuit D and the field winding B of the generator can be detected with higher sensitivity than a ground fault that takes place at the N side field circuit E.

Next, with reference to FIG. 2, the construction of a field ground fault detector according to an embodiment of the present invention will be described.

Figure 2:
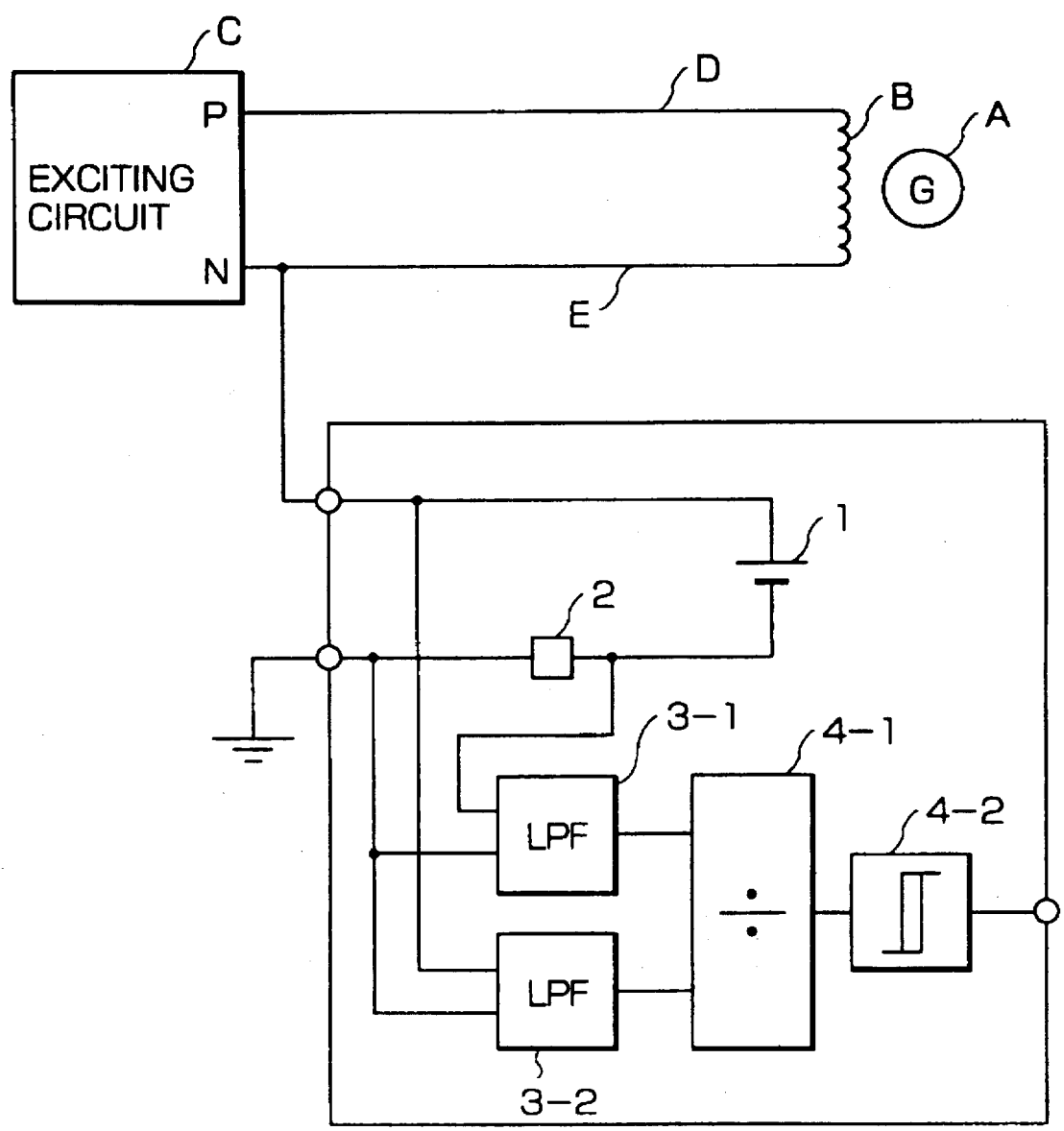
FIG. 2 is a schematic diagram showing a construction of a field ground fault detector according to a first embodiment of the present invention.

In the field ground fault detector shown in FIG. 2, the level ratio determining circuit 4 shown in FIG. 1 is constructed of a dividing circuit 4-1 and a level determining circuit 4-2. The voltage supplied from the low-pass filters 3-1 and 3-2 are output to the dividing circuit 4-1. The output of the dividing circuit 4-1 is supplied to the level determining circuit 4-2. The level determining circuit 4-2 outputs the determined result of a ground fault to the outside of the field fault detector.

Next, the operation of the field ground fault detector will be described.

When a ground fault takes place in the N side field circuit E, a current of which the voltage of the DC voltage source 1 is divided by the sum of the resistance of the resistor 2 and the resistance of the ground fault resistor. The voltage applied between the N side field circuit E and the ground is the product of the current and the ground fault resistor. The voltage applied between both the terminals of the resistor 2 is the product of the current and the resistance of the resistor 2. In other words, the voltage applied between both the terminals of the resistor 2 is proportional to the resistance of the resistor 2. The voltage applied between the N side field circuit E and the ground is proportional to the resistance of the ground fault resistor. The voltage applied between the N side field circuit and the ground is denoted by $V_1$ and the voltage applied between both the terminals of the resistor 2 is denoted by $V_2$. $V_1$ and $V_2$ can be represented by the following equations.

$$V_1 = \frac{V}{(R+Rg)} \cdot Rg, \quad V_2 = \frac{V}{(R+Rg)} \cdot R$$

where R is the resistance of the resistor 2; Rg is the resistance of the ground fault resistor; and V is the DC voltage of the DC voltage source 1.

The voltage $V_2$ applied between both the terminals of the resistor 2 is a DC voltage due to the presence of the low-pass filter 3-1. The voltage $V_1$ applied between the N side field circuit E and the ground is a DC voltage due to the presence of the low-pass filter 3-2. The voltages $V_1$ and $V_2$ are supplied to the dividing circuit 4-1. The dividing circuit 4-1 divides the DC voltage $V_l$ applied between the N side field circuit E and the ground through the low-pass filter circuit 3-2 by the DC voltage $V_2$ applied between both the terminals of the resistor 2 through the low-pass filter 3-2. The level ratio of $V_1/V_2$ is determined by the level determining circuit 4-2.

Since the resistance of the ground fault resistor 2 that is used as a criterion for the level determination is known, the resistance of the ground fault resistor to be detected is n times as low as or lower than the resistance of the ground fault resistor, it is determined that a ground fault takes place. In other words, when the ratio $V_1/V_2$ of the output voltage of the dividing circuit 4-1 is equal to or lower than n (where $V_1/V_2 \leq n$), the level determining circuit 4-2 determines that a ground fault takes place and outputs the determined result of the ground fault to the outside of the field ground fault detector.

Figure 3:
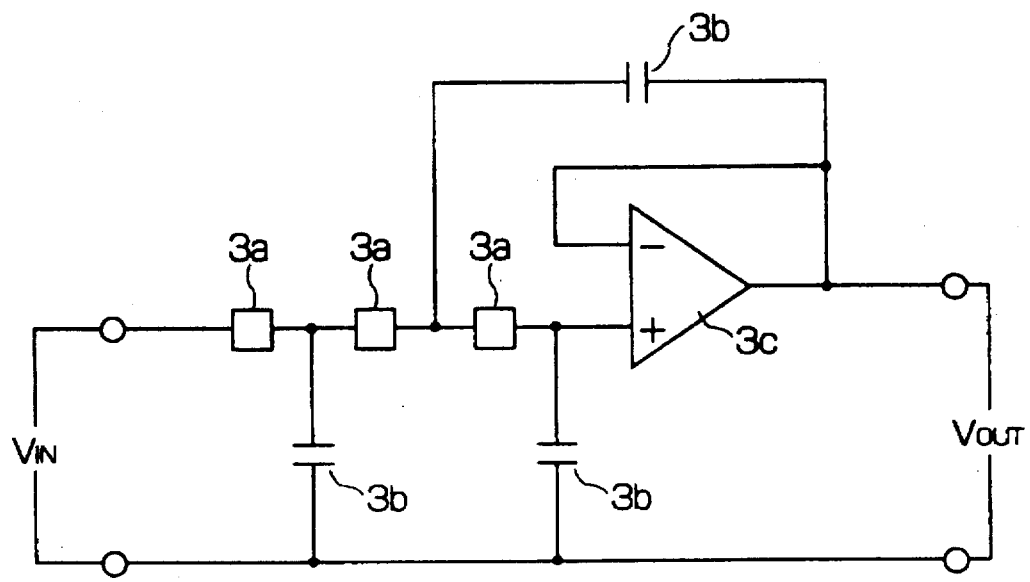
FIG. 3 is a schematic diagram showing a circuit construction of a filter according to the present invention.

FIG. 3 shows an example of circuit constructions of the low-pass filters 3-1 and 3-2.

Figure 4:
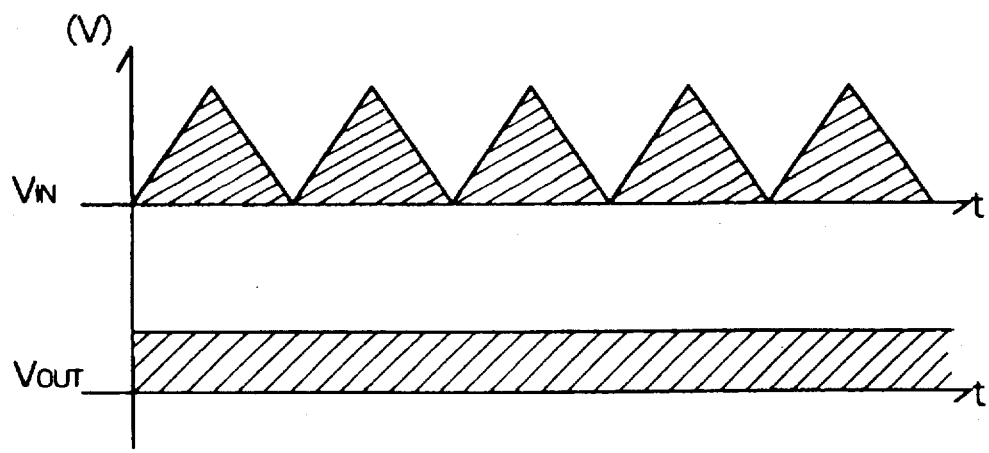
FIG. 4 is a schematic diagram showing input and output waveforms of the filter according to the present invention.

This circuit is a tertiary low-pass filter constructed of resistors 3a, capacitors 3b, and an arithmetic amplifier 3c. When the cut-off frequency is 10 Hz or less, AC components of 100 Hz or higher contained in an input voltage $V_{IN}$ are attenuated to −60 dB or less. The DC component is not attenuated and output as an output voltage $V_{OUT}$. FIG. 4 shows an example of input and output waveforms of the low-pass filters 3-1 and 3-2. The input voltage $V_{IN}$ contains an AC voltage with a frequency six times higher than the frequency of the commercial AC voltage and a DC voltage. The AC voltage is excited by a thyristor. The output voltage $V_{OUT}$ is a DC voltage of which the AC component of the input voltage $V_{IN}$ is removed. The constructions of the low-pass filters are not limited to those shown in FIG. 3. Instead, as long as the low-pass filters remove the above-described AC voltage component, any construction may be used.

According to this embodiment, since the resistance ratio of the resistance of a predetermined resistor and the resistance of the ground fault resistor is obtained corresponding to the ratio of the voltage applied between both the terminals of the resistor and the voltage applied between both terminals of the ground fault resistor, the resistance of the ground fault resistor is obtained corresponding to the predetermined resistance. Thus, even if the DC voltage of the DC voltage source 1 varies due to any cause, the detecting sensitivity of the ground fault can be kept constant.

When the present invention is applied for a field circuit of a generator of a thyristor exciting type, since the low-pass filters are used in a DC voltage extracting circuit, a field ground fault detector with high performance that is not affected by a higher harmonic voltage contained in the excited voltage and that is free of incorrect detection and non-detection can be accomplished.

The DC voltage extracting circuit that extracts a DC voltage from the voltage applied between both terminals of a predetermined resistor and the voltage applied between both terminals of the ground fault resistor (the voltage between the N side field circuit E and the ground) is not limited to the low-pass filters. Instead, any circuit that can extract the DC component can be used.

The present invention is not limited to the above-described embodiment. Instead, the following modifications are available.

(1) The division of the dividing circuit 4-1 shown in FIG. 2 is performed by dividing the DC voltage $V_2$ applied between both the terminals of the resistor 2 through the low-pass filter 3-1 by the DC voltage $V_1$ applied between the N side field circuit E and the ground through the low-pass filter 3-2. When the voltage level that is output from the dividing circuit 4-1 is equal to or higher than a predetermined level ($V_2/V_1 \geq 1/n$), the level determining circuit 4-2 determines that a ground fault takes place. Thus, the same effect as the above-described embodiment can be accomplished.

Figure 5:
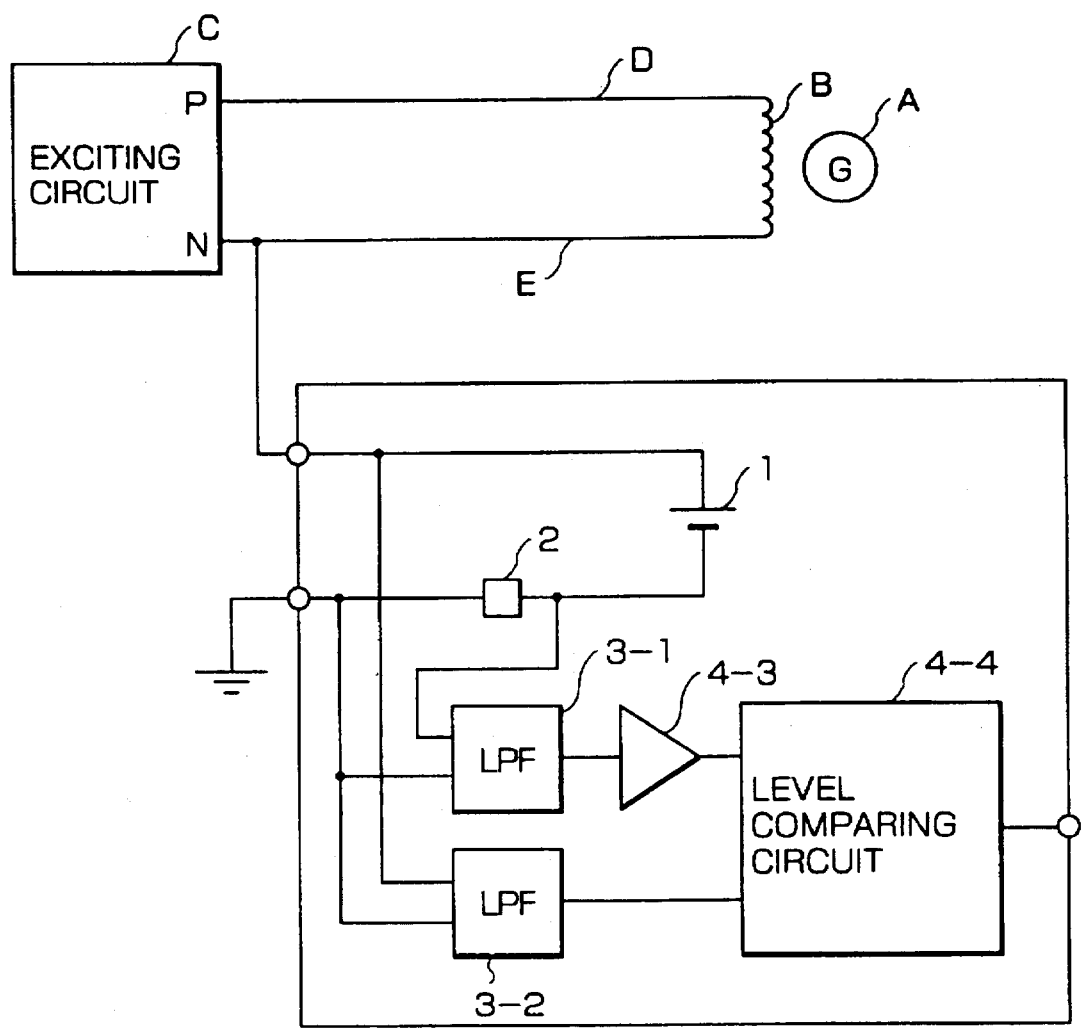
FIG. 5 is a schematic diagram showing a construction of a field ground fault detector according to another embodiment of the present invention.

(2) As shown in FIG. 5, the DC voltage $V_2$ applied between both terminals of the resistor 2 through the low-pass filter 3-1 is amplified to a predetermined level by an amplifying circuit 4-3. A level comparing circuit 4-4 compares a DC voltage $nÅV_2$ that is output from the amplifying circuit 4-3 and the DC voltage $V_1$ applied between the N side field circuit E and the ground. When the amplified voltage of the amplifying circuit 4-3 is equal to or higher than the DC voltage applied between the N side field circuit E and the ground through the low-pass filter 3-2 ($nÅV2 \geq V1$), the level comparing circuit 4-4 determines that a ground fault takes place. Thus, the same effect as the above-described embodiment can be accomplished. When the determining criterion of a ground fault is n times lower than the resistance of the register 2, the amplitude of the amplifying circuit 4-3 is n.

Figure 6:
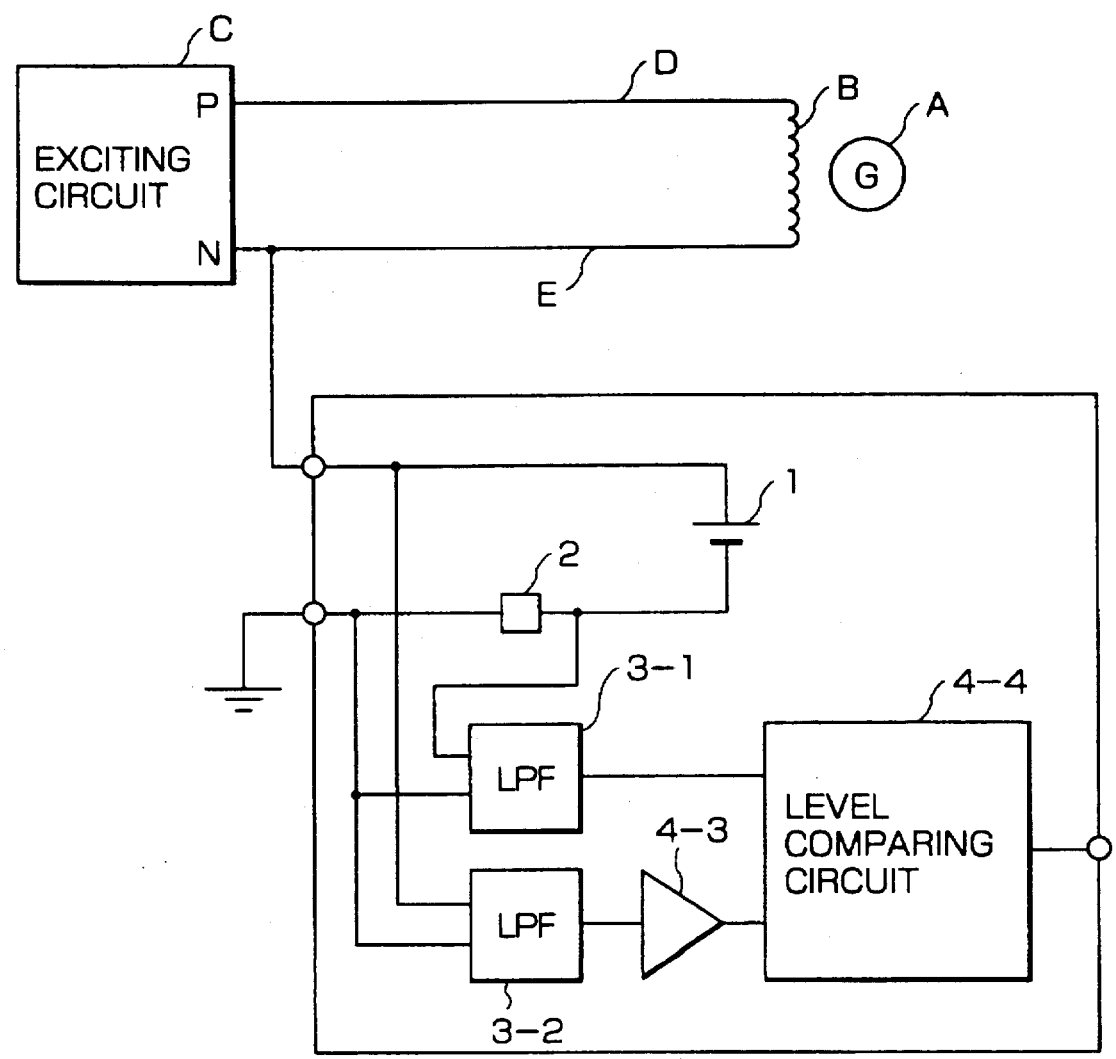
FIG. 6 is a schematic diagram showing a construction of a field ground fault detector according to another embodiment of the present invention.

(3) As shown in FIG. 6, an amplifying circuit 4-3 is disposed between the low-pass filter 3-2 and the level comparing circuit 4-4. The amplifying circuit 4-3 amplifies the DC voltage $V_1$ applied between the N side field circuit E and the ground with a predetermined amplitude. When the DC voltage applied between both terminals of the resistor 2 through the low-pass filter 3-1 is equal to or higher than the DC voltage supplied from the amplifying circuit 4-3 ($V2 \geq V_1/n$), the level comparing circuit 4-4 determines that a ground fault takes place. Thus, the same effect as the above-described embodiment can be accomplished.

When the determining criterion of a ground fault is n times as low as or lower than the resistance of the resistor 2, the amplitude (attenuation) of the amplifying circuit 4-3 is 1/n.

Figure 7:
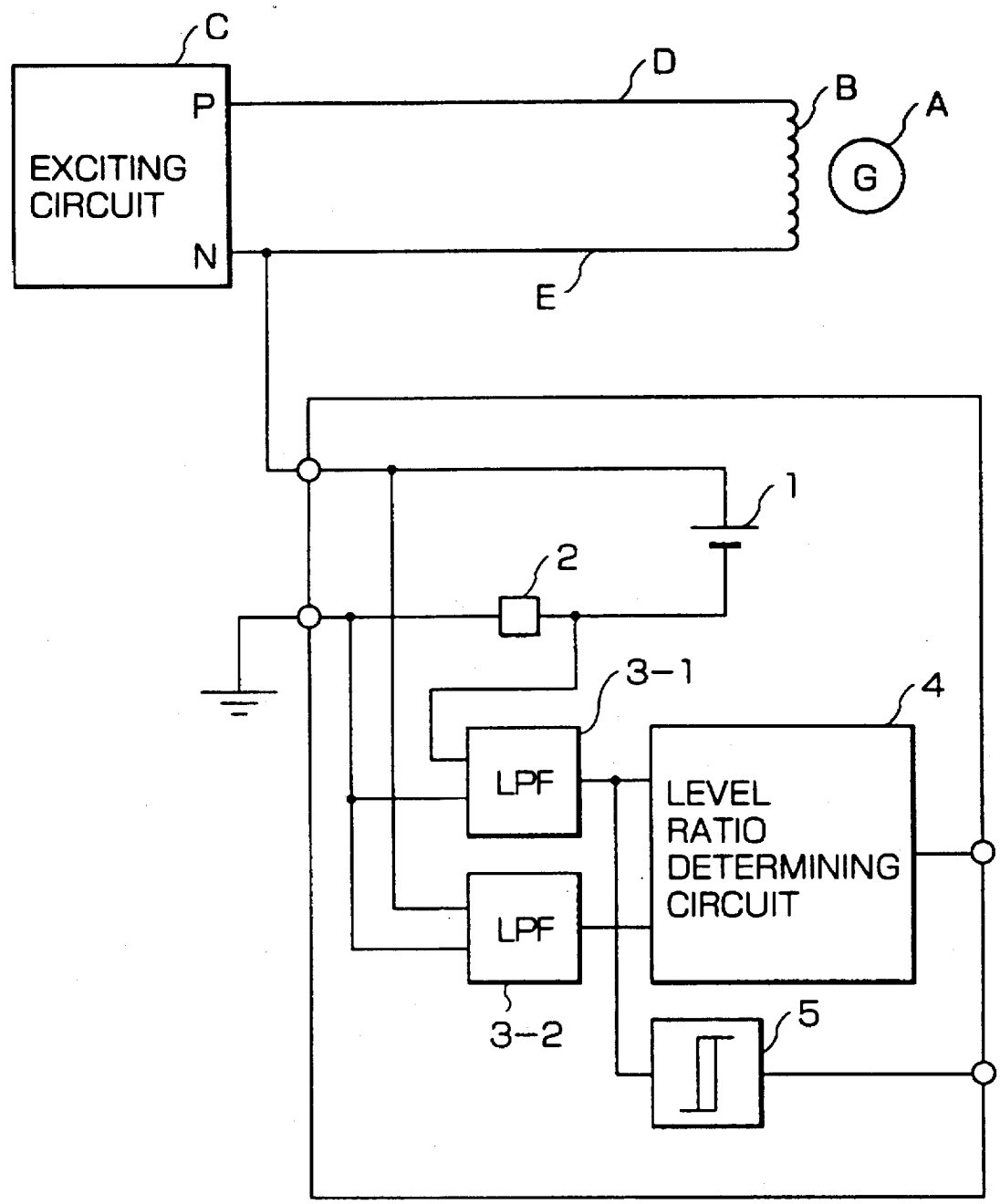
FIG. 7 is a schematic diagram showing a construction of a field ground fault detector according to another embodiment of the present invention.

(4) As shown in FIG. 7, a level determining circuit 5 is provided. The DC voltage applied to both terminals of the resistor 2 through the low-pass filter 3-1 is input to the level determining circuit 5. When the voltage level of the low-pass filter 3-1 is equal to or higher than a predetermined level, the level determining circuit 5 determines that a ground fault takes place in the P side field circuit or the field winding of the generator other than the N side field circuit E. Thus, the level determining circuit 5 outputs a signal that represents the position of the ground fault to the outside.

When a voltage that exceeds the level of the DC voltage of the DC voltage source 1 is input to the level determining circuit 5, it determines that a ground fault takes place in a portion other than the N side field circuit E.

In other words, when a ground fault takes place in the P side field circuit D or the field winding B of the generator, the excited voltage of the field circuit is applied between the N side field circuit E and the ground through the ground fault resistor.

In this case, since a plus voltage is applied to the ground based on the N side exciting circuit E, the polarity of the N side exciting circuit E is the same as that of the DC voltage of the DC voltage source 1. A voltage applied between both the terminals of the resistor 2 is denoted by $V_2$. $V_2$ is represented by the following equation.

$$V_2 = \frac{(V + V_F)}{(R + Rg)} \times R$$

where R is the resistance of the resistor 2; Rg is the resistance of the ground fault resistor; V is the DC voltage; and $V_F$ is the excited voltage at the ground fault point based on the N side field circuit E.

When a ground fault takes place in the N side field circuit E, the relation of $V_2 \leq V$ is satisfied. On the other hand, when a ground fault takes place in the P side field circuit D or the field winding B of the generator, the relation of $V_2 \leq (V+V_F)$ is satisfied. Thus, when the following determining expression is satisfied, it is determined that a ground fault takes place in a portion other than the N side field circuit E.

Figure 8:
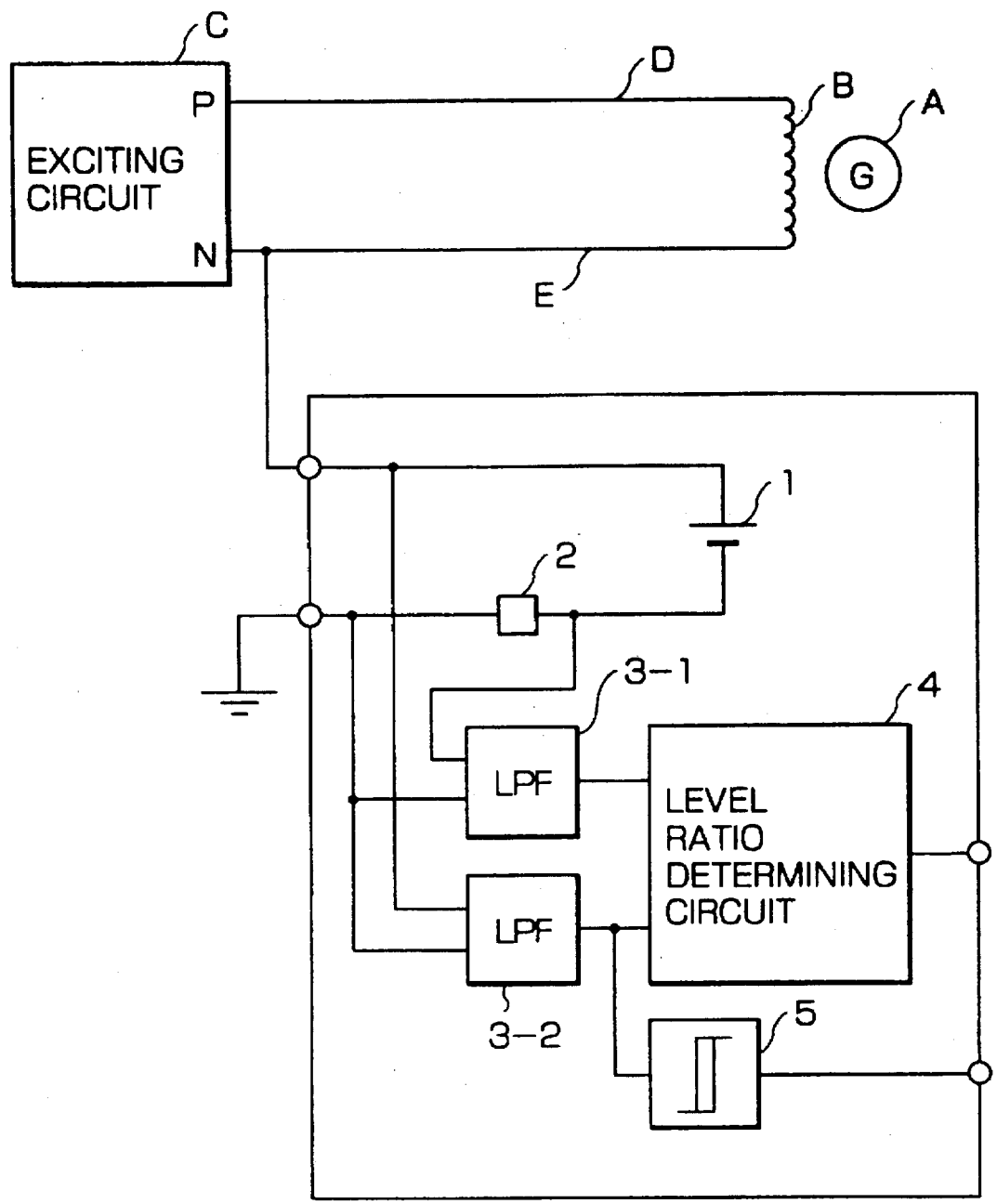
FIG. 8 is a schematic diagram showing a construction of a field ground fault detector according to another embodiment of the present invention.

Determining expression: $V_2 > V$ (5) As shown in FIG. 8, an input of the level determining circuit 5 is an output voltage of the low-pass filter 3-2. When a DC voltage applied between the N side field circuit E and the ground through the low-pass filter 3-2 is equal to or less than a predetermined level, it is determined that a ground fault takes place in the P side field circuit D or the field winding B of the generator other than the N side field circuit. Thus, a signal that represents the position of the ground fault is output to the outside.

When a negative voltage is input, the level determining circuit 5 determines that a ground fault takes place in a portion other than the N side field circuit E.

In other words, when a ground fault takes place in the P side field circuit D or the field winding B of the generator, an excited voltage of the exciting circuit is applied between the N side field circuit E and the ground through the ground fault resistor.

In this case, since a plus voltage is applied to the ground, the polarity of the N side field circuit E is the same as the polarity of the DC voltage 1. A voltage applied between the N side field circuit E and the ground is denoted by $V_1$. $V_1$ is represented by the following equation.

$$V_1 = \frac{(V + V_F)}{(R + Rg)} \times Rg - V_F$$

where R is the resistance of the resistor 2; Rg is the resistance of the ground fault resistor; V is the DC voltage; and $V_F$ is the excited voltage at the ground fault point based on the N side field circuit E.

When a ground fault takes place in the N side field circuit E, the relation of $V_1 \geq$ is satisfied. On the other hand, when a ground fault takes place in the P side field circuit D or the field winding B of the generator, the relation of $V_1 \geq -V_F$ is satisfied. Thus, when the following determining expression is satisfied, it is determined that a ground fault takes place in a portion other than the N side field circuit E.

Figure 9:
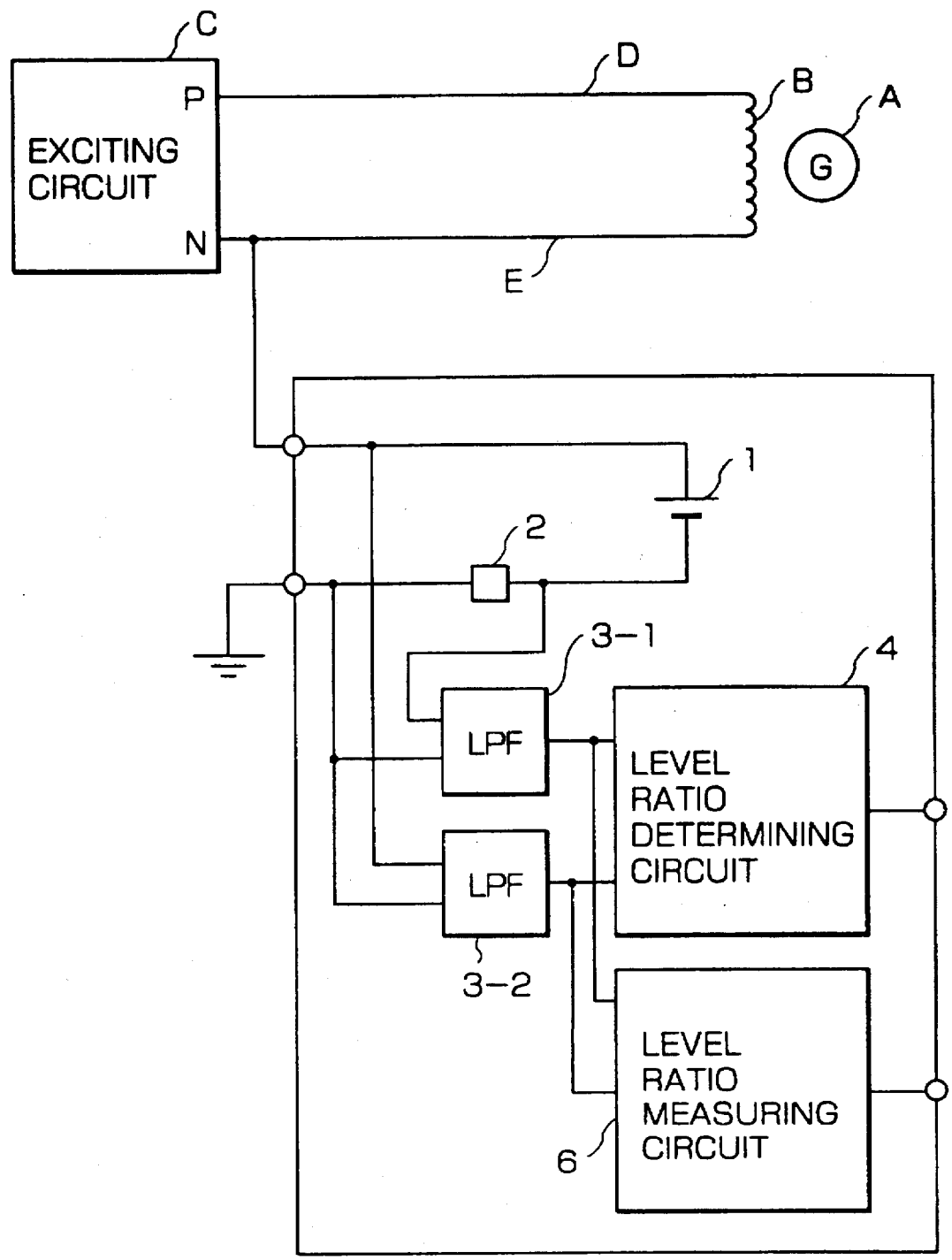
FIG. 9 is a schematic diagram showing a construction of a field ground fault detector according to another embodiment of the present invention.

Determining expression: $V_1 < 0$ (6) As shown in FIG. 9, a level ratio measuring circuit 6 is added to the construction shown in FIG. 1. The level ratio measuring circuit 6 inputs the voltage applied between both the terminals of the resistor 2 through the low-pass filter 3-1 and the DC voltage applied between the N side field circuit E and the ground through the low-pass filter 3-2 and outputs a signal corresponding to these voltages. Thus, the level ratio measuring circuit 6 outputs a signal proportional to the resistance of the ground fault resistor. Thus, a field ground fault detector having a function of measuring the resistance of the-ground fault resistor can be accomplished.

The field ground fault detector can monitor the resistance of the ground fault resistor along with the logic output of detected ground fault corresponding to the predetermined ground fault detecting level. Thus, before detecting a ground fault, the field ground fault detector can output any level alarm corresponding to the resistance of a normal insulation resistor.

In addition, the field ground fault detector can determine a ground fault mode corresponding to a variation of the resistance of the ground fault resistor.

Figure 10:
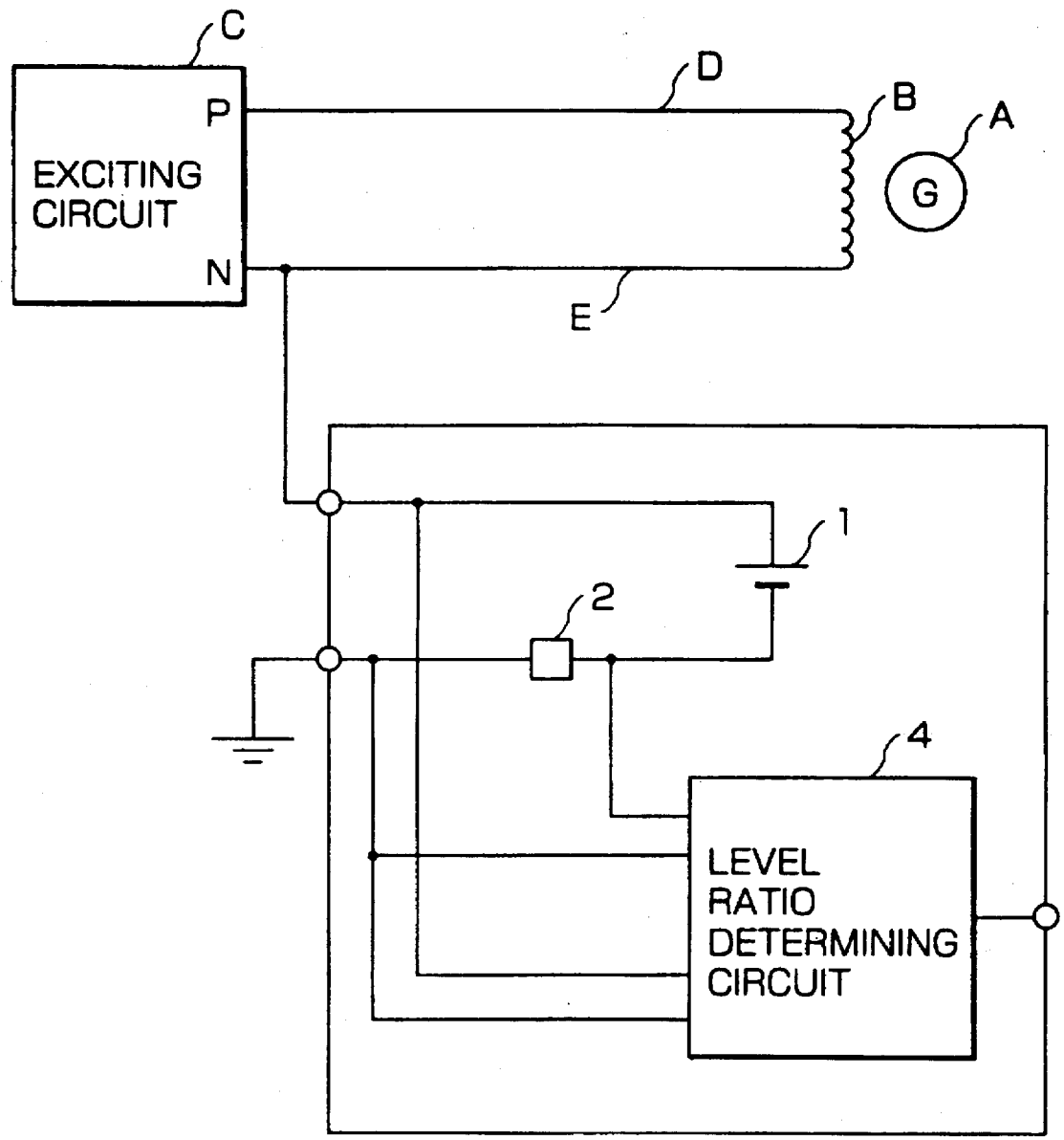
FIG. 10 is a schematic diagram showing a construction of a field ground fault detector according to another embodiment of the present invention.

(7) As shown in FIG. 10, the voltage applied between both the terminals of the resistor 2 (this voltage is denoted by $V_2$) and the voltage applied between the N side field circuit E and the ground (this voltage is denoted by $V_1$) are directly input to the level ratio comparing circuit 4. The level ratio determining circuit 4 determines the ratio of the levels of the voltage applied between both the terminals of the resistor 2 and the voltage applied between the N electrode side field circuit E and the ground. Thus, according to this embodiment, when a ground fault of the field circuit is detected, the ratio of the resistance of a predetermined resistor and the resistance of the ground fault resistor is obtained corresponding to the ratio of the voltage applied between both the terminals of the predetermined resistor and the voltage applied between both terminals of the ground fault resistor so as to obtain the resistance of the ground fault resistor. Thus, even if the DC voltage varies due to any cause, the detecting sensitivity of the ground fault can be kept constant. In particular, since the level ratio determining circuit 4 determines the level with predetermined operation-restoration delay time periods, even if the input voltage of the level ratio determining circuit 4 contains an AC component, the output of the level ratio determining circuit 4 is prevented from being intermittent. Thus, the same effect as the construction shown in FIG. 1 can be accomplished. For determining the ratio of levels, the modification examples (1) to (6) can be applied and the same effects thereof can be accomplished.

Next, with reference to the accompanying drawings, a field ground fault relay according to an embodiment of the present invention will be described.

Figure 11:
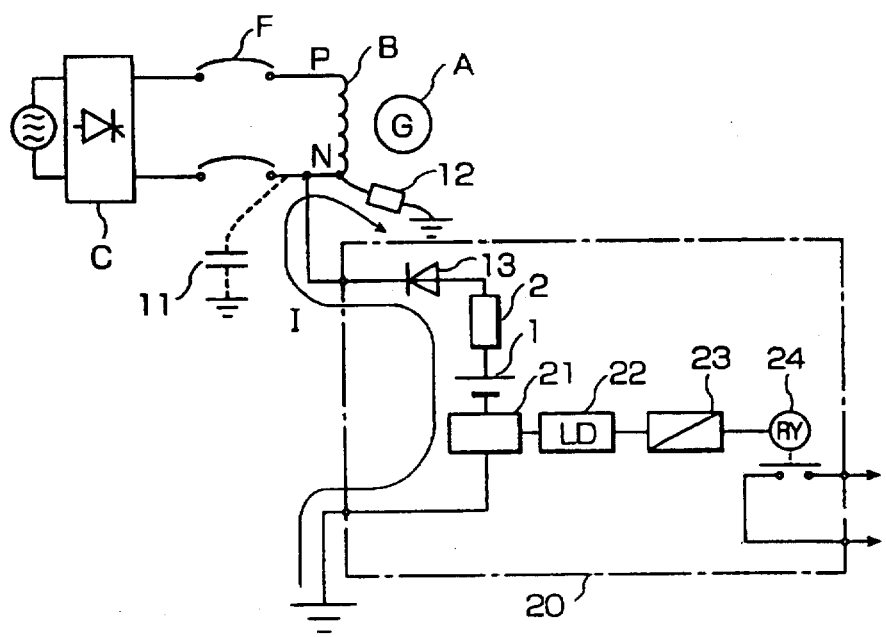
FIG. 11 is a schematic diagram showing a construction of a field ground fault relay according to the present invention.

FIG. 11 is a schematic diagram showing a construction of a field ground fault relay 20 according to an embodiment of the present invention.

As shown in FIG. 11, the field ground fault relay 20 is connected in series between the negative electrode N side of the field circuit and the ground. The field ground fault relay 20 comprises a DC power supply 1, a resistor 2, a rectifier 13, an average value calculating circuit 21, a level detecting circuit 22, an operation time delay circuit 23, and an auxiliary relay 24. Next, the average value calculating circuit 21 will be described in detail.

When a three-phase AC voltage is rectified into a DC voltage and excited by varying the conduction angle of a thyristor, a higher harmonic component is generated. The higher harmonic component normally has a frequency six times higher than the basic frequency of the three-phase AC power supply. Depending on the rectifying type, the frequency of the higher harmonic component varies to some extent.

From a result of waveform analysis of a measured ground fault current, it is known that the main component thereof has a frequency six times higher than the rated frequency.

Since the distortion component of the ground fault current has a frequency six times higher than the rated frequency, when this distortion component is decreased or removed, the DC current I corresponding to the voltage of the DC power supply 1 of the relay, the inner resistor 2 of the relay, and the ground fault resistor 12 can be extracted.

Next, with reference to the timing charts of FIGS. 12A–12D, the operation (time response) of the field ground fault relay 20 according to the present invention will be described.

Figure 12A:
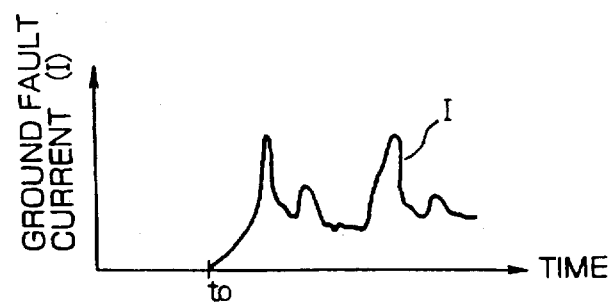
FIGS. 12A–12D are signal timing charts for a field ground fault relay according to the present invention.

When a ground fault takes place in the field circuit, as shown in FIG. 12A, the waveform of the ground field current I is very distorted.

The average value calculating circuit 21 extracts the average current from the distorted ground fault current. The average current that passes through the average value calculating circuit 21 is denoted by a current I'. The main component of the current I' is a DC current of which a higher harmonic component with a frequency higher than the basic frequency is removed.

An output signal 22A of the level detecting circuit 22 that detects an absolute value of an output current of the average value calculating circuit 21 is a continuous output signal.

Figure 12B:
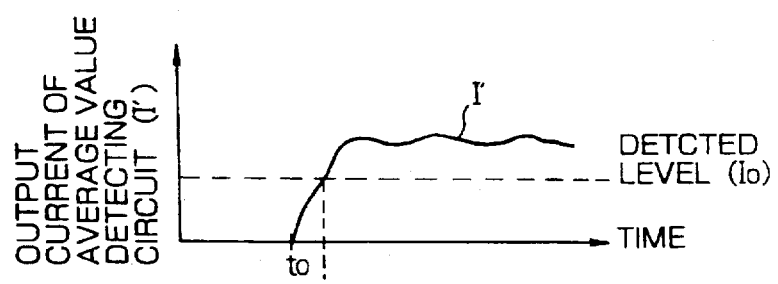
Figure 12C:
Figure 12D:
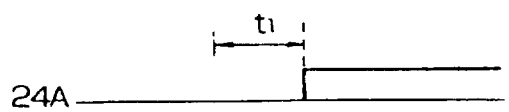

In FIG. 12B, $I_0$ represents a detecting level (sensitivity) for detecting a ground fault. When the ground fault current I' that exceeds the detecting level $I_0$ is successively supplied to the operation time delay circuit 23, a trip command of the field breaker F (namely, a signal causing the breaker to be opened or a signal representing an alarm) is output.

As described above, according to the field ground fault relay of the present invention shown in FIG. 11, even if it is applied for a field circuit of a thyristor direct exciting type using a thyristor rectifier, since the field ground fault relay operates with a DC average value, it is not largely affected by a field voltage. A field ground fault relay that operates corresponding to a DC resistance equivalent to the insulation resistance of the field circuit without a variation of the sensitivity can be accomplished.

The present invention is not limited to the field ground fault relay according to the above-described embodiment. However, the present invention can be applied for the following modifications.

Figure 13:
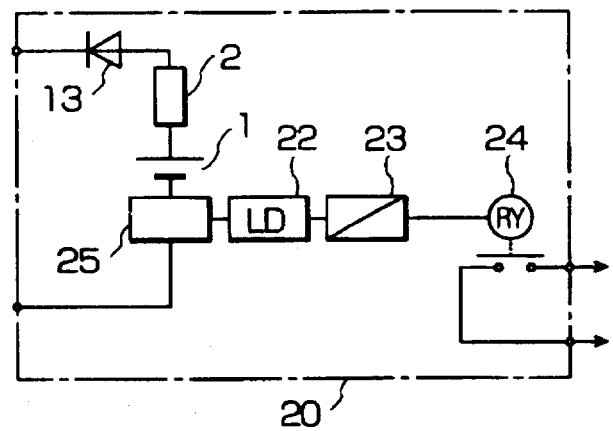
FIG. 13 is a schematic dialgram showing a construction of a field ground fault relay according to another embodiment of the present invention.

(1) FIG. 13 shows a construction of a field ground fault relay according to another embodiment of the present invention.

In this embodiment, an effective value of a ground fault current is calculated. It is determined whether or not the effective value exceeds a predetermined level of the relay. In this embodiment, an effective value calculating circuit 25 is used instead of the average value calculating circuit 21.

The effective value calculating circuit 25 squares an instantaneous value of an input current and then calculates the sum of the input current. Thereafter, the circuit 25 calculates the root of the sum. For example, when a basic wave is 100% and a higher harmonic wave is 50%, the effective value calculating circuit outputs a higher harmonic wave that is compressed to 25% in comparison with the basic wave of 100%. Thus, the higher harmonic wave contained in the input current is reduced. In addition, the output current of the effective value calculating circuit 25 against the ground fault current I whose waveform is distorted has a waveform similar to that of a DC current.

Thus, the output signal of the level detecting circuit 22 has a continuous waveform rather than an intermittent waveform of the conventional relay. Thus, the same effect as the above-described embodiment can be accomplished.

In addition, even if the frequency varies, since the effective value does not vary, the relay can securely operate.

(2) With reference to FIG. 14, a construction of a field ground fault relay according to another embodiment of the present invention will be described.

In this embodiment, both the average value calculating circuit 21 and the effective value calculating circuit 25 are provided. When one of the circuits 21 and 25 operates, a relay output is obtained.

In reality, the field ground fault relay comprises an average value calculating circuit 21, an effective value calculating circuit 25, two level detecting circuits 22A and 22B, an OR circuit 26, an operation time delay circuit 23, and an auxiliary relay 24.

Figure 15:
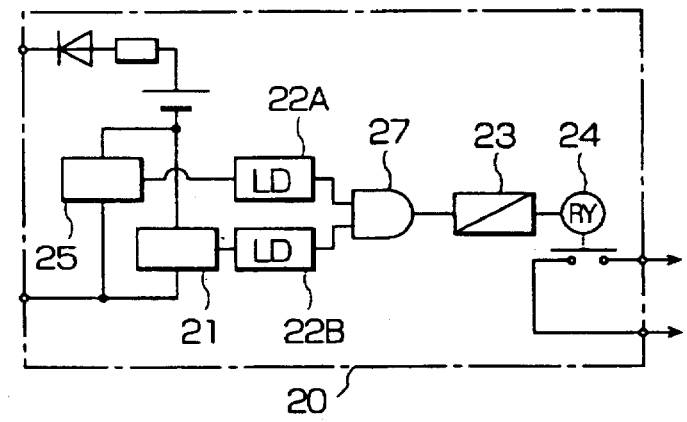
FIG. 15 is a schematic diagram showing a construction of a field ground fault relay according to another embodiment of the present invention.

(3) FIG. 15 shows a construction of a field ground fault relay according to another embodiment of the present invention.

In this embodiment, both the average calculating circuit 21 and the effective value calculating circuit 25 are provided. In addition, an AND circuit 27 is provided. When both the level detecting circuits operate, the AND circuit 27 outputs a relay output. Since two types of ground fault current detecting circuits that are based on different detecting theories are provided, the relay can securely operates.

In reality, the field ground fault relay according to this embodiment comprises an average value calculating circuit 21, an effective value calculating circuit 25, two level detecting circuits 22A and 22B, an AND circuit 27, an operation time delay circuit 23, and an auxiliary relay 24.

Figure 16:
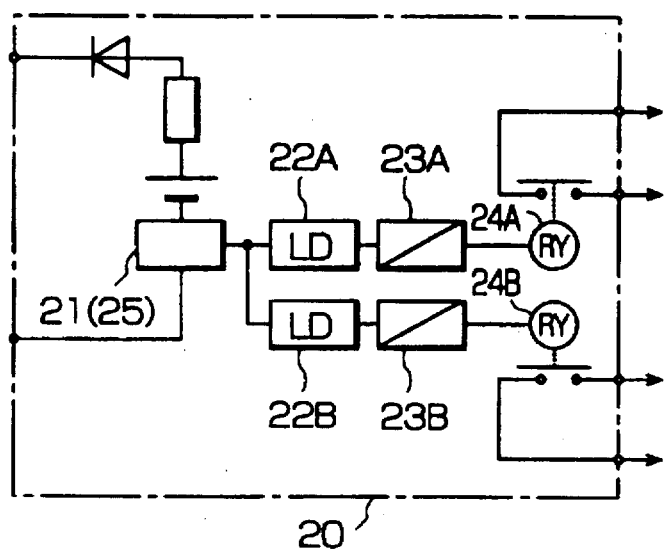
FIG. 16 is a schematic diagram showing a construction of a field ground fault relay according to another embodiment of the present invention.

(4) FIG. 16 shows a construction of a field ground fault relay according to another embodiment of the present invention.

In this embodiment, two level detecting circuits are provided. When the level detecting circuits detect the same level, the detecting reliability can be improved as a redundant system. On the other hand, when the level detecting circuits detect a high level and a low level, they can be used for issuing an alarm and tripping the breaker. When the detecting level of the field circuit of the generator is lower than the high level, the insulation state of the generator can be maintained. On the other hand, when the detecting level of the field circuit is lower than the low level, the breaker of the generator is shut off and the generator is stopped.

In reality, the field ground fault relay according to this embodiment comprises an average value calculating circuit 21 (or an effective value calculating circuit 25), two level detecting circuits 22A and 22B, two operation time delay circuits 23A and 23B, and two auxiliary relays 24A and 24B.

Figure 17:
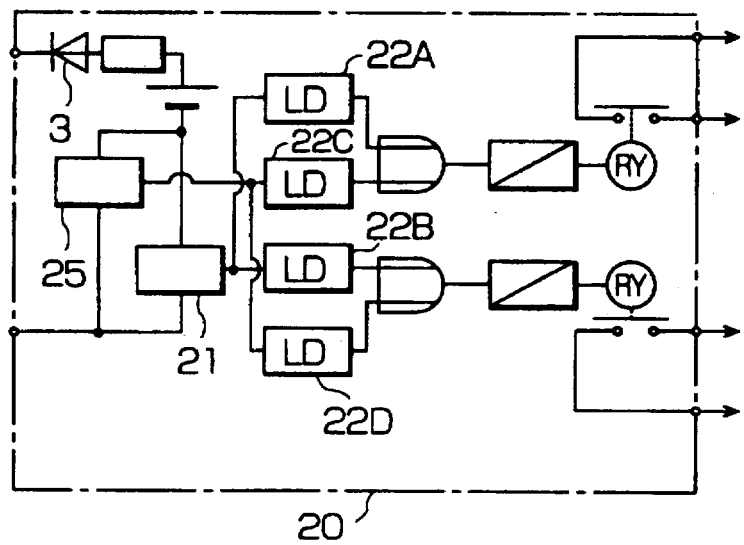
FIG. 17 is a schematic diagram showing a construction of a field ground fault relay according to another embodiment of the present invention.

(5) FIG. 17 shows a construction of a field ground fault relay according to another embodiment of the present invention.

Figure 14:
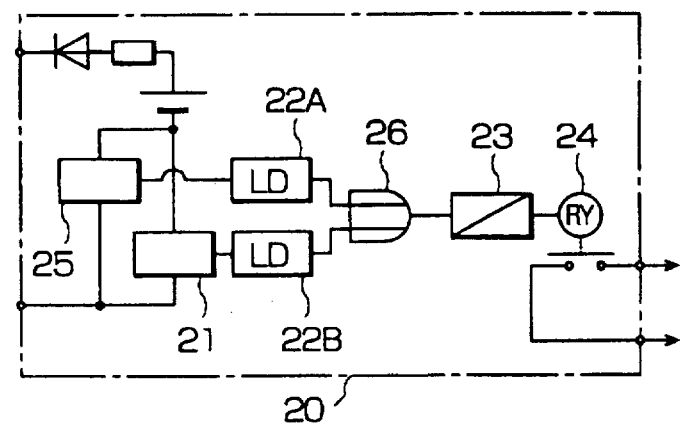
FIG. 14 is a schematic diagram showing a construction of a field ground fault relay according to another embodiment of the present invention.

In this embodiment, two level detecting circuits are added to the construction of the embodiment shown in FIG. 14.

In reality, the field ground fault relay according to this embodiment comprises an average value calculating circuit 21, an effective value calculating circuit 25, four level detecting circuits 22A to 22D, two OR circuits, two operation time delay circuits, and two auxiliary relays.

Figure 18:
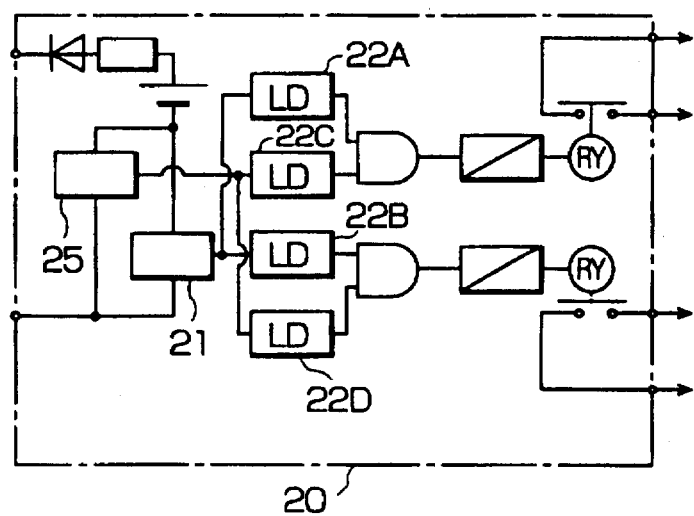
FIG. 18 is a schematic diagram showing a construction of a field ground fault relay according to another embodiment of the present invention.
Figure 19:
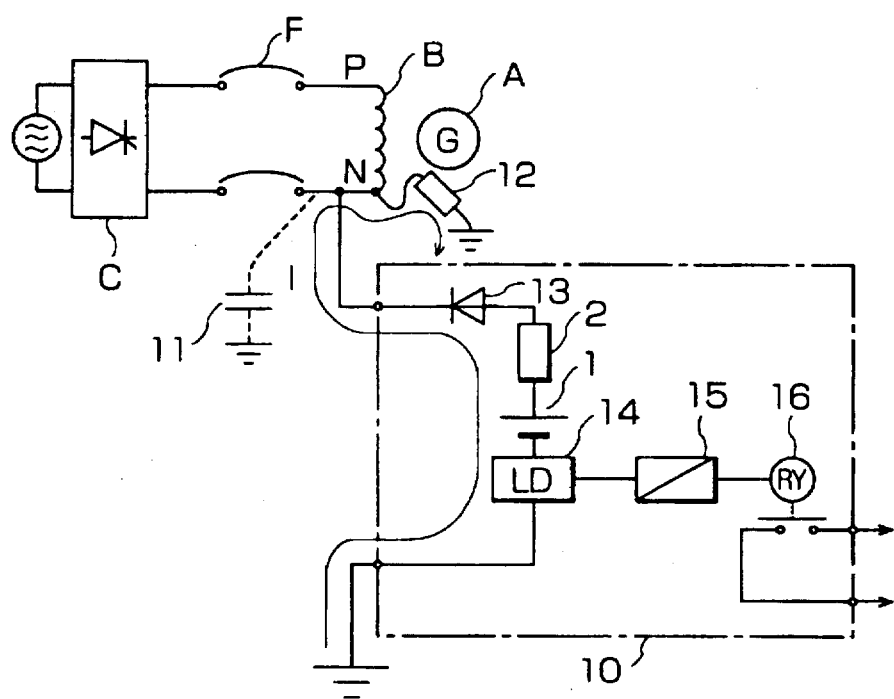
FIG. 19 is a schematic diagram showing a construction of a conventional field ground fault relay.

(6) FIG. 18 shows a construction of a field ground fault relay according to another embodiment of the present invention.

In this embodiment, two level detecting circuits are added to the construction of the embodiment shown in FIG. 15.

In reality, the field ground fault relay according to this embodiment comprises an average value calculating circuit 21, an effective value calculating circuit 25, four level detecting circuits 22A to 22D, two AND circuits, two operation state delay circuits, and two auxiliary relays.

(7) As other embodiments, the field ground fault detectors shown in FIGS. 1 to 10 may be used instead of the average value calculating circuit and the effective value calculating circuit of the field ground fault relays.

(8) As another embodiment, an output that represents an occurrence of a ground fault Of the level ratio determining circuit shown in FIG. 1 or the like and an output of the operation delay circuit 23 shown in FIG. 11 or the like are ANDed by an AND circuit. An output of the AND circuit may be supplied to the auxiliary relay 24 shown in FIG. 11 or the like. Since the AND circuit ANDs two outputs, the reliability of the shut-off command to the auxiliary relay 24 can be improved.

Since the ratio of the resistance of a predetermined resistor and the resistance of a ground fault resistor is obtained corresponding to the ratio of a voltage applied between both terminals of the resistor and a voltage applied between both terminals of the ground fault resistor, the resistance of the ground fault resistor is obtained corresponding to the resistance of the predetermined resistor. Thus, even if the DC voltage varies due to any cause, the detecting sensitivity of the ground fault can be kept constant.

In addition, even if the present invention is applied for a field circuit of a generator of a thyristor exciting type, a field ground fault detector with high performance that is not affected by a higher harmonic voltage contained in an excited voltage and that is free of incorrect detection and no-detection can be accomplished.

Moreover, in the condition that an excited voltage is applied, when a ground fault takes place in the P side field circuit and the winding portion of the generator, if the voltage between the ground fault point and the N side field circuit is equal to or higher than a predetermined level and the resistance of the ground fault resistor is equal to or lower than a predetermined value, it can be determined that a ground fault takes place in the P side field circuit or the winding portion of the generator other than the N side field circuit. Thus, a ground fault position determining function can be added. When a signal that is proportional to the ratio of the resistance of the inner resistor and the resistance of the ground fault resistor is output, a function for measuring the resistance of the ground fault resistor can be accomplished.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A field ground fault detector for detecting an occurrence of a ground fault in a field circuit, comprising:

a resistor having first and second terminals, the first terminal of the resistor connected to ground;

a DC voltage source connected to the second terminal of the resistor and to a negative electrode of the field circuit for outputting a DC voltage output;

a first DC voltage extracting circuit having inputs respectively connected to the first and second terminals of the resistor for extracting a DC voltage between the first and second terminals of the resistor:

a second DC voltage extracting circuit having inputs respectively connected to the negative electrode of the field circuit and ground for extracting a DC voltage between the negative electrode of the field circuit and ground; and a determining circuit connected to the outputs of the first and second DC voltage extracting circuits for determining the occurrence of a ground fault from a ratio of the extracted DC voltage of the first DC voltage extracting circuit and the extracted DC voltage of the second DC voltage extracting circuit.

2. The field ground fault detector as set forth in claim 1, further comprising a ground fault position determining circuit connected to the first DC voltage extracting circuit for comparing the extracted DC voltage of said first DC voltage extracting circuit with a predetermined value corresponding to the DC voltage output of the DC voltage source, and determining that a ground fault has occurred at the negative electrode of the field circuit based upon the comparison.

3. The field ground fault detector as set forth in claim 1, further comprising a ground fault position determining circuit connected to the second DC voltage extracting circuit for comparing the extracted DC voltage of said second DC voltage extracting circuit with a predetermined value, and determining that a ground fault has occurred at the negative electrode of the field circuit based upon the comparison.

4. A field ground fault detector for detecting an occurrence of a ground fault in a field circuit, comprising:
- a resistor having first and second terminals, the first terminal connected to ground;
- a DC voltage source connected to a negative electrode of the field circuit and the second terminal of the resistor;
- a first filter circuit for receiving a voltage between the first and second terminals of the resistor and for attenuating an AC component of the received voltage to extract a DC voltage;
- a second filter circuit for receiving a voltage between the negative electrode of the field circuit and ground and for attenuating an AC component of the received voltage to extract a DC voltage; and
- a determining circuit for determining the occurrence of a ground fault from a ratio of the extracted DC voltage from the first filter circuit and the extracted DC voltage from the second filter circuit.

5. The field ground fault detector as set forth in claim 4, wherein said determining circuit comprises:
- a dividing circuit for dividing the output voltage of said second filter circuit by the output voltage of said first filter circuit; and
- a level determining circuit for determining that a ground fault takes place when the output level of said dividing circuit is equal to or less than a predetermined value.

6. The field ground fault detector as set forth in claim 4, wherein said determining circuit comprises:
- a dividing circuit for dividing the output voltage of said first filter circuit by the output voltage of said second filter circuit; and
- a level determining circuit for determining that a ground fault takes place when the output level of said dividing circuit is equal to or less than a predetermined value.

7. The field ground fault detector as set forth in claim 4, wherein said determining circuit comprises:
- an amplifying circuit for amplifying the output voltage of said first filter circuit to a predetermined level; and
- a level determining circuit for comparing the output level of the output voltage of said amplifying circuit and the output voltage of said second filter circuit, and determining that a ground fault takes place when the output voltage of said amplifying circuit is equal to or higher than the output voltage of said second filter circuit.

8. The field ground fault detector as set forth in claim 4, wherein said determining circuit comprises:
- an amplifying circuit for amplifying the output voltage of said second filter circuit to a predetermined level; and
- a level determining circuit for comparing the output level of an output voltage of said amplifying circuit and the output voltage of said first filter circuit, and determining that a ground fault takes place when the output voltage of said amplifying circuit is equal to or less than the output voltage of said first filter circuit.

9. A field ground fault detector for detecting an occurrence of a ground fault in a field circuit, comprising:
- a resistor having first and second terminals, the first terminal connected to ground;
- a DC voltage source connected to a negative electrode of the field circuit and the second terminal of the resistor for providing a DC voltage output;
- a DC voltage extracting circuit connected to the first and second terminals of the resistor for extracting a DC voltage between the first and second terminals of the resistor; and
- a ground fault position determining circuit connected to the DC voltage extracting circuit for comparing the extracted DC voltage from said DC voltage extracting circuit with a predetermined value corresponding to the DC voltage output of the DC voltage source and for determining that a ground fault has occurred at the negative electrode of the field circuit based upon the comparison.

10. A field ground fault detector for detecting an occurrence of a ground fault in a field circuit, comprising:
- a resistor having first and second terminals, the first terminal connected to ground;
- a DC voltage source connected to a negative electrode of the field circuit and the second terminal of the resistor;
- a DC voltage extracting circuit connected to the negative electrode of the field circuit and ground for extracting a DC voltage between the negative electrode of the field circuit and ground; and
- a ground fault position determining circuit connected to the DC voltage extracting circuit first comparing the extracted DC voltage from the DC voltage extracting circuit with a predetermined value and for determining that a ground fault has occurred on the negative electrode side of the field circuit based upon the comparison.

11. A field ground fault detector for detecting an occurrence of a ground fault in a field circuit, comprising:
- a resistor having first and second terminals, the first terminal connected to ground;
- a DC voltage source connected to a negative electrode of the field circuit and the second terminal of the resistor;
- a first DC voltage extracting circuit connected to the first and second terminals of the resistor for extracting a DC voltage between the first and second terminals of the resistor;
- a second DC voltage extracting circuit connected to the negative electrode of the field circuit and ground for extracting a DC voltage between the negative electrode of the field circuit and ground; and
- a measuring circuit connected to the first DC voltage extracting circuit and the second DC voltage extracting circuit for measuring a ground fault resistance based on a ratio of the extracted DC voltage from said first DC voltage extracting circuit and the extracted DC voltage from said second DC voltage extracting circuit.

12. A field ground fault detector for detecting an occurrence of a ground fault in a field circuit, comprising:
- a resistor having first and second terminals, the first terminal connected to ground;
- a DC voltage source connected to a negative electrode of the field circuit and round through the second terminal of the resistor; and
- a determining circuit connected to the first and second terminals of the resistor, the negative electrode of the field circuit, and ground for receiving a voltage between the first and second terminals of the resistor, for receiving a voltage between the negative electrode of the field circuit and ground, and for determining that a ground fault has occurred based upon a ratio of the received voltage between the first and second terminals of the resistor and the received voltage between the negative electrode of said field circuit and ground.

* * * * *

UNITED STATES PATENT AND TRADEMARK OFFICE
CERTIFICATE OF CORRECTION

PATENT NO. : 5,675,465
DATED : October 07, 1997
INVENTOR(S) : Toshio TANAKA et al.

It is certified that error appears in the above-indentified patent and that said Letters Patent is hereby corrected as shown below:

Claim 12, column 16, line 53, delete "round through".

Signed and Sealed this

Sixth Day of April, 1999

Attest:

Q. TODD DICKINSON

*Attesting Officer*     *Acting Commissioner of Patents and Trademarks*